US012707634B2

(12) United States Patent
Hu

(10) Patent No.: US 12,707,634 B2
(45) Date of Patent: Aug. 11, 2026

(54) THREE-DIMENSIONAL INTEGRATION STRUCTURE AND METHOD OF FORMING THE SAME

(71) Applicant: Yangtze Memory Technologies Co., Ltd., Wuhan (CN)

(72) Inventor: SiPing Hu, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 996 days.

(21) Appl. No.: 17/451,335

(22) Filed: Oct. 19, 2021

(65) Prior Publication Data

US 2023/0065535 A1 Mar. 2, 2023

Related U.S. Application Data

(63) Continuation of application No. PCT/CN2021/116100, filed on Sep. 2, 2021.

(51) Int. Cl.
*H10B 41/35* (2023.01)
*H10B 41/27* (2023.01)
(Continued)

(52) U.S. Cl.
CPC ............ *H10B 41/35* (2023.02); *H10B 41/27* (2023.02); *H10B 41/41* (2023.02); *H10B 41/50* (2023.02);
(Continued)

(58) Field of Classification Search
CPC ........ H10B 41/27; H10B 41/35; H10B 41/41; H10B 41/50; H10B 43/27; H10B 43/35;
(Continued)

(56) References Cited

U.S. PATENT DOCUMENTS 10,867,983 B2 12/2020 Chen et al.
10,985,169 B2 4/2021 Kai et al.
(Continued)

FOREIGN PATENT DOCUMENTS

CN 112185980 A * 1/2021 ............ H10B 43/27

OTHER PUBLICATIONS

International Search Report issued May 31, 2022 in PCT/CN2021/116100 filed on Sep. 2, 2021, 4 pages.
(Continued)

*Primary Examiner* — Marcos D. Pizarro
(74) *Attorney, Agent, or Firm* — Oblon, McClelland, Maier & Neustadt, L.L.P.

(57) ABSTRACT

A semiconductor device is provided. The semiconductor device includes a first substrate layer having a first side over which devices are formed. In the semiconductor device, a first dielectric structure is formed over the first side of the first substrate layer in which the devices are positioned. The first dielectric structure includes a bottom surface in contact with the first side of the first substrate layer. A portion of the bottom surface of the first dielectric structure is not covered by the first substrate layer. The semiconductor device also includes a first electronic structure positioned over the uncovered portion of the bottom surface of the first dielectric structure such that the first electronic structure and the first substrate layer are positioned at a same side of the bottom surface of the first dielectric structure. The first electronic structure is bonded to the first dielectric structure.

10 Claims, 9 Drawing Sheets

(51) Int. Cl.

| | |
|---|---|
| ***H10B 41/41*** | (2023.01) |
| ***H10B 41/50*** | (2023.01) |
| ***H10B 43/27*** | (2023.01) |
| ***H10B 43/35*** | (2023.01) |
| ***H10B 43/40*** | (2023.01) |
| ***H10B 43/50*** | (2023.01) |
| ***H10B 80/00*** | (2026.01) |
| ***H10W 20/20*** | (2026.01) |
| ***H10W 80/00*** | (2026.01) |
| ***H10W 90/00*** | (2026.01) |
| ***H10W 90/20*** | (2026.01) |

(52) U.S. Cl.
CPC ............ *H10B 43/27* (2023.02); *H10B 43/35* (2023.02); *H10B 43/40* (2023.02); *H10B 43/50* (2023.02); *H10B 80/00* (2023.02); *H10W 20/20* (2026.01); *H10W 80/312* (2026.01); *H10W 80/327* (2026.01); *H10W 90/20* (2026.01); *H10W 90/297* (2026.01); *H10W 90/722* (2026.01); *H10W 90/724* (2026.01); *H10W 90/726* (2026.01)

(58) Field of Classification Search
CPC ........ H10B 43/40; H10B 43/50; H10B 80/00; H10B 80/312; H10B 80/327; H01L 2225/06513; H01L 2225/06517; H01L 2225/0652; H01L 2225/06541; H01L 2225/1011; H01L 2224/80895; H01L 2224/80896; H10W 90/20; H10W 90/297; H10W 90/722; H10W 90/724; H10W 90/726; H10W 80/312; H10W 80/327
See application file for complete search history.

(56) References Cited

U.S. PATENT DOCUMENTS

| | | | |
|---|---|---|---|
| 11,069,703 | B2 | 7/2021 | Nishida et al. |
| 2020/0286905 | A1 | 9/2020 | Kai et al. |
| 2021/0118866 | A1 | 4/2021 | Chen et al. |
| 2021/0118867 | A1 | 4/2021 | Chen et al. |

OTHER PUBLICATIONS

Combined Chinese Office Action and Search Report issued on Apr. 26, 2025 in the corresponding Chinese Patent Application No. 202180003166.7, 7 pages.

* cited by examiner

200B'
200A
600
600
600
200E
242a
258
200D
236
230 (200F)
200C
230b
230
230a
242

THREE-DIMENSIONAL INTEGRATION STRUCTURE AND METHOD OF FORMING THE SAME

RELATED APPLICATION

This application is a bypass continuation of International Application No. PCT/CN2021/116100, filed on Sep. 2, 2021. The entire disclosure of the prior application is hereby incorporated by reference in its entirety.

BACKGROUND

As critical dimensions of devices in integrated circuits shrink to the limits of common memory cell technologies, designers have been looking to techniques for stacking multiple planes of memory cells to achieve greater storage capacity, and to achieve lower costs per bit. A 3D-NAND memory device is an exemplary device of stacking multiple planes of memory cells to achieve greater storage capacity, and to achieve lower costs per bit. In a X-tacking structure of a 3D-NAND memory device, the periphery circuits which handle data I/O as well as memory cell operations are processed on a separate wafer (CMOS wafer) using a logic technology node (i.e., 14 nm, 7 nm) that enables the desired I/O speed and functions. Once the processing of a cell array wafer is completed, the two wafers are connected electrically through millions of metal vertical interconnect accesses (VIAs) that are formed simultaneously across the whole wafer in one process step. By using the innovative cross-stacking structure, the periphery circuits are now above cell array chip formed in the cell array wafer, which enables much higher NAND bit density than related 3D NAND with limited increase in total cost.

SUMMARY

The present disclosure describes embodiments generally related to structures and methods for a three dimensional monolithic integration (3D) to integrate multiple functions into functional blocks vertically stacked by one or more chips.

According to an aspect of the disclosure, a semiconductor device is provided. The semiconductor device can include a first substrate layer having a first side over which devices are formed. In the semiconductor device, a first dielectric structure can be formed over the first side of the first substrate layer in which the devices are positioned. The first dielectric structure can include a bottom surface in contact with the first side of the first substrate layer. In addition, a portion of the bottom surface of the first dielectric structure can be uncovered by the first substrate layer. The semiconductor device can also include a first electronic structure positioned over the uncovered portion of the bottom surface of the first dielectric structure such that the first electronic structure and the first substrate layer are positioned at a same side of the bottom surface of the first dielectric structure. The first electronic structure can further be bonded to the first dielectric structure.

In some embodiments, the first electronic structure can be bonded to the bottom surface of the first dielectric structure through a polysilicon layer by a laser annealing process, where the polysilicon layer can be positioned between the first electronic structure and the first dielectric structure and configured to function as a substrate layer of the first electronic structure.

In some embodiments, the first electronic structure can be formed from a portion of the first substrate layer.

In some embodiments, the devices can include at least one of a field effect transistor, a diode, a bipolar junction transistor, a capacitor, a resistor, or an inductor.

In some embodiments, the devices can include memory cells. The memory cells can include a stack of alternating insulating layers and word lines that is positioned over the first side of the first substrate layer in a staircase configuration and arranged in the first dielectric structure. The memory cell can include a channel structure that extends from the first side of the first substrate layer and extend through the insulating layers and the word lines. The memory cells can also include a word line contact that is positioned over the first side of the first substrate layer and extends from one of the word lines.

The semiconductor device can include a first contact structure extending from the first side of the first substrate layer and extending through the first dielectric structure. The semiconductor device can include a through silicon via (TSV) formed in the first substrate layer, where the TSV can extend through the first substrate layer and be in contact with the first contact structure. The semiconductor device can include a first metal line formed over a top surface of the first dielectric structure that is opposite to the bottom surface. The first metal line can be coupled to one of the channel structure, the first contact structure, and the word line contact. Further, a pad structure can be positioned over and coupled to the TSV.

The semiconductor device can include a second dielectric structure formed over a first side of a second substrate layer, where the first side of the first substrate layer and the first side of the second substrate layer can be aligned facing each other. The semiconductor device can include a transistor formed in the first side of a second substrate layer and positioned in the second dielectric structure. The transistor can be configured to operate the memory cells. In the semiconductor device, a second metal line can be formed over the second dielectric structure and coupled to the first metal line such that the memory cells are coupled to the transistor.

The semiconductor device can include a source/drain (S/D) contacts extending from a S/D region of the transistor, a gate contact extending from a gate structure of the transistor, and a second contact structure extending from the first side of the second substrate layer and extending through the second dielectric structure. The second metal line can be coupled to one of the S/D contact, the gate contact, and the second contact structure. The first metal line can be coupled to the second metal line through a bonding via that is positioned between the first metal line and the second metal line.

In some embodiments, the first electronic structure can include one of logic circuitry, storage circuitry, and analog circuitry.

In some embodiments, the semiconductor device can include a second electronic structure that is positioned over the uncovered portion of the bottom surface of the first dielectric structure and coupled to the first electronic structure, and a third electronic structure that can be coupled to the transistor through the first contact structure and the second contact structure.

According to another aspect of the disclosure, a method for fabricating a semiconductor device is provided. In the method, devices can be formed over a first side of a first substrate layer. A first dielectric structure can be formed over the first side of the first substrate layer such that the devices are positioned in the first dielectric structure, where the first dielectric structure can include a bottom surface in contact with the first side of the first substrate layer. Further, a portion of the first substrate layer can be removed such that a portion of the bottom surface of the first dielectric structure is uncovered by the first substrate layer. A first electronic structure can subsequently be bonded to the first dielectric structure, where the first electronic structure can be positioned over the uncovered portion of the bottom surface of the first dielectric structure such that the first electronic structure and the first substrate layer are positioned at a same side of the bottom surface of the first dielectric structure.

In some embodiments, the first electronic structure can include one of logic circuitry, storage circuitry, and analog circuitry, and the devices can include at least one of a field effect transistor, a diode, a bipolar junction transistor, a capacitor, a resistor, an inductor, or a memory cell.

In the method, in order to bond the first electronic structure, a polysilicon layer can be formed over the uncovered portion of the bottom surface of the first dielectric structure. The first electronic structure can be positioned over the polysilicon layer. An annealing process can subsequently be performed so that the polysilicon layer can connect the first electronic structure and the first dielectric structure and function as a substrate layer for the first electronic structure.

In some embodiments, the annealing process includes a laser annealing process. The laser process can have laser energy larger than 0.1 J/cm$^2$, a laser beam wavelength in a range from 350 nm to 650 nm, a process time in a range from 10 fs to 1 us per pulse. The laser process can be a continuous laser annealing process or a pulsed laser annealing process.

In some embodiments, the first electronic structure can be formed from a portion of the first substrate layer.

In some embodiments, the forming the devices can include forming memory cells over the first side of the first substrate layer. The memory cells can include a stack of alternating insulating layers and word lines that is positioned over the first side of the first substrate layer in a staircase configuration and arranged in the first dielectric structure. The memory cells can also include a channel structure that extends from the first side of the first substrate layer and extends through the insulating layers and the word lines. The memory cells can further include a word line contact that is positioned over the first side of the first substrate layer and extends from one of the word lines.

In the method, a first contact structure can be formed to extend from the first side of the first substrate layer and extend through the first dielectric structure. A TSV can be formed in the first substrate layer, where the TSV can extend through the first substrate layer and be in contact with the first contact structure. A first metal line can be formed over a top surface of the first dielectric structure that is opposite to the bottom surface, where the first metal line can be coupled to one of the channel structure, the first contact structure, and the word line contact. Further, a pad structure can be formed over and coupled to the TSV.

In the method, a second dielectric structure can be formed over a first side of a second substrate layer, where the first side of the first substrate layer and the first side of the second substrate layer can be aligned facing each other. A transistor can be formed in the first side of a second substrate layer. The transistor can be positioned in the second dielectric structure and configured to control the memory cells. A second metal line can be formed over the second dielectric structure. The second metal line can be coupled to the first metal line so that the memory cells are coupled to the transistor.

In the method, a source/drain (S/D) contact can be formed to extend from a S/D region of the transistor. A gate contact can be formed to extend from a gate structure of the transistor. A second contact structure can be formed to extend from the first side of the second substrate layer and extend through the second dielectric structure. The second metal line can be coupled to one of the S/D contact, the gate contact, and the second contact structure. The first metal line can be coupled to the second metal line through a bonding via. The bonding via can be positioned between the first metal line and the second metal line.

In some embodiments, a second electronic structure can be formed over the uncovered portion of the bottom surface of the first dielectric structure and coupled to the first electronic structure, and a third electronic structure can be formed to be coupled to the transistor through the first contact structure and the second contact structure.

BRIEF DESCRIPTION OF THE DRAWINGS

Aspects of the present disclosure can be understood from the following detailed description when read with the accompanying figures. It is noted that, in accordance with the standard practice in the industry, various features are not drawn to scale. In fact, the dimensions of the various features may be increased or reduced for clarity of discussion.

DETAILED DESCRIPTION

Figure 1:
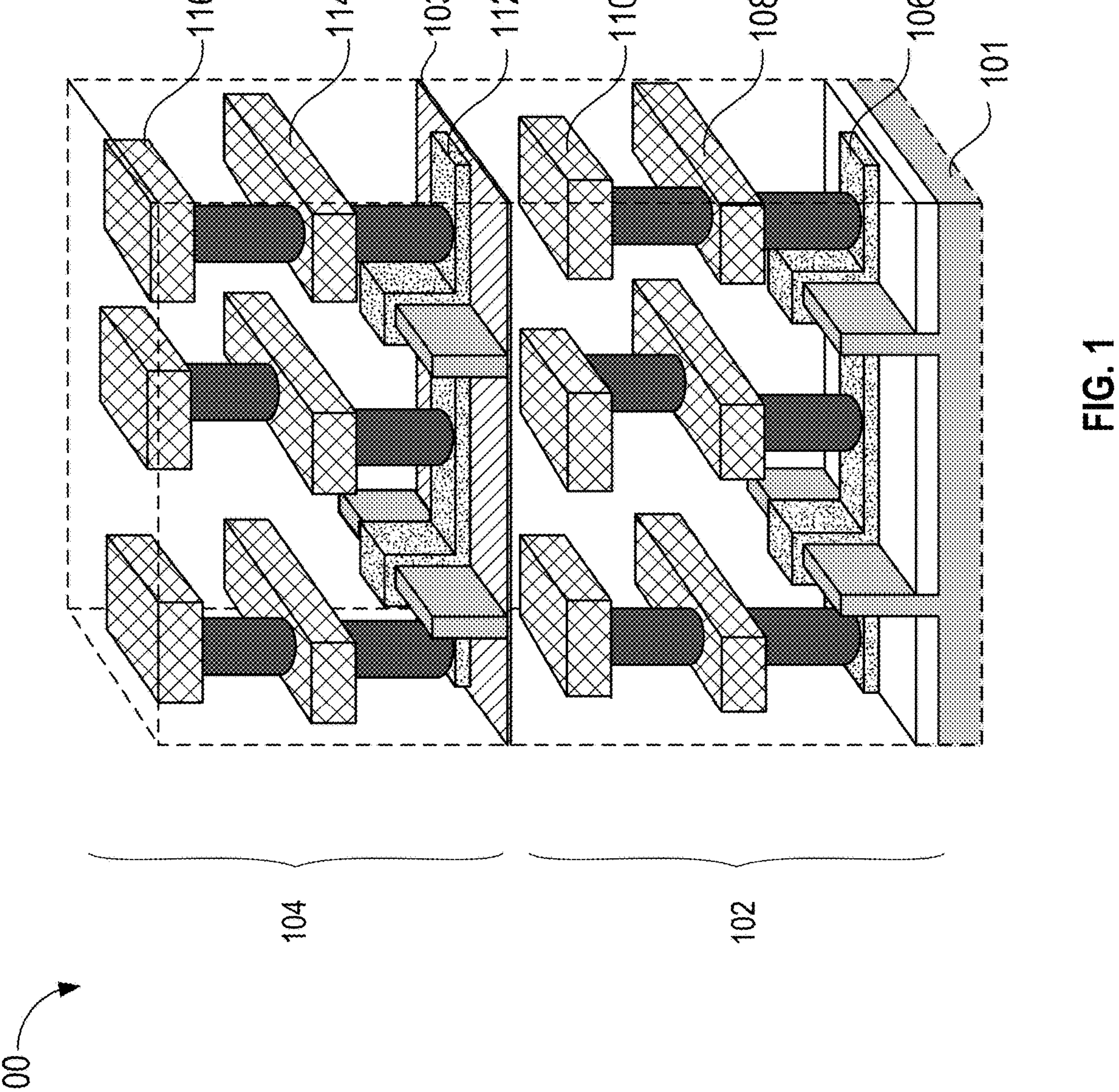
FIG. 1 is a perspective view of a 3D monolithic integration structure in a related example, in accordance with exemplary embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features may be in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A three dimensional monolithic integration (3D) integrates multiple functions into functional blocks vertically stacked by one or more chips. The 3D monolithic integration can be a next important direction for breaking the bottleneck of Moore's law in manufacturing faster, lower cost and smaller chips. At present, some technical difficulties include the process temperature cannot be too high after the fabrication of metal interconnection, and the requirements of wafer bonding alignment and a high through silicon via (TSV) density limit the application of the 3D monolithic integration.

In the 3D monolithic integration, a donor wafer cleaving process can be applied to stack two chips to each other. In the donor wafer cleaving process, a top wafer (or top layer) can receive a hydrogen implantation process, where the hydrogen ions can be injected under a device layer arranged over the top wafer to form a cleave plane. The cleave plane can act as a guide for cleaving the top wafer during a subsequent separation process. Further, the top wafer can be flipped to bond with a bottom wafer (or bottom layer). A cleaving process (or separation process), such as an annealing process (e.g., at 400° C.) or a sideways mechanical force, can be applied to remove a portion of the top wafer along the cleave plane. Thus, the device layer and a remaining portion of the top wafer can be bonded to the bottom wafer. The donor wafer cleaving process requires a high temperature in the cleaving process, which can have an impact on devices in the bottom wafer. In addition, the TSV process introduced in subsequent steps has limitations in connection density and quantity.

FIG. 1 shows another exemplary embodiment of the 3D monolithic integration, where a laser annealing process can be applied to form a 3D monolithic integration structure 100. As shown in FIG. 1, the 3D monolithic integration structure (or structure) 100 can include a bottom structure (or bottom layer) 102 and a top structure (or top layer) 104. The bottom structure 102 can include a plurality of fin field-effect transistors (FinFETs) 106 over a substrate 101, a plurality of M1 layers 108 positioned over the FinFETs 106 and coupled to the FinFETs 106, and a plurality of M2 layers 110 positioned over the M1 layers 108 and coupled to the M1 layers 108. The top structure 104 can include a plurality of fin field-effect transistors (FinFETs) 112 over the M2 layers 110, a plurality of M1 layers 114 positioned over the FinFETs 112 and coupled to the FinFETs 112, and a plurality of M2 layers 116 positioned over the M1 layers 114 and coupled to the M1 layers 114. In order to bond the bottom structure 102 and the top structure, an amorphous silicon (a-Si) layer can be formed between an interface 103 of the bottom structure 102 and the top structure 104. A laser annealing process can subsequently be applied to the structure 100 by directing a laser beam toward the structure 100. The a-Si layer can be heated by the laser energy transmitted by the laser beam and consequently converted into polysilicon. The polysilicon can in turn bond (or glue) the bottom structure 102 and the top structure 104 to each other. The laser annealing process can provide a low cost and a high throughput bonding process, but it is normally suitable for integrating structures (or modules) of a same type. For example, as shown in FIG. 1, both the bottom structure 102 and the top structure 104 are logic structures.

In yet another exemplary embodiment of the 3D monolithic integration, several wafers (or dies) can be stacked and bonded together to form a stacked structure through bonding vias, for example. However, such a stacked structure requires a complex design. In addition, the spatial matching degree is difficult to be unified, and the spatial utilization rate is reduced.

In the disclosure, a 3D integration structure, such as an X-tacking structure, to integrate different/multiple modules (or device structures) based on the laser annealing process is provided. The X-tacking structure can apply a TSV-free architecture so that challenges of the density and quantity of connecting through holes associated with the TSV can be avoided. In addition, the X-tacking structure can also be compatible with the integration of multiple modules (or device chips, device structures) and of different types, through which high space utilization efficiency can be obtained. The laser annealing process can also solve the influence of a high temperature on the reliability of metal interconnection. Further, the X-tacking structure can be applied to bond one or more wafers, based on the designs of the X-tacking structure.

Figure 2:
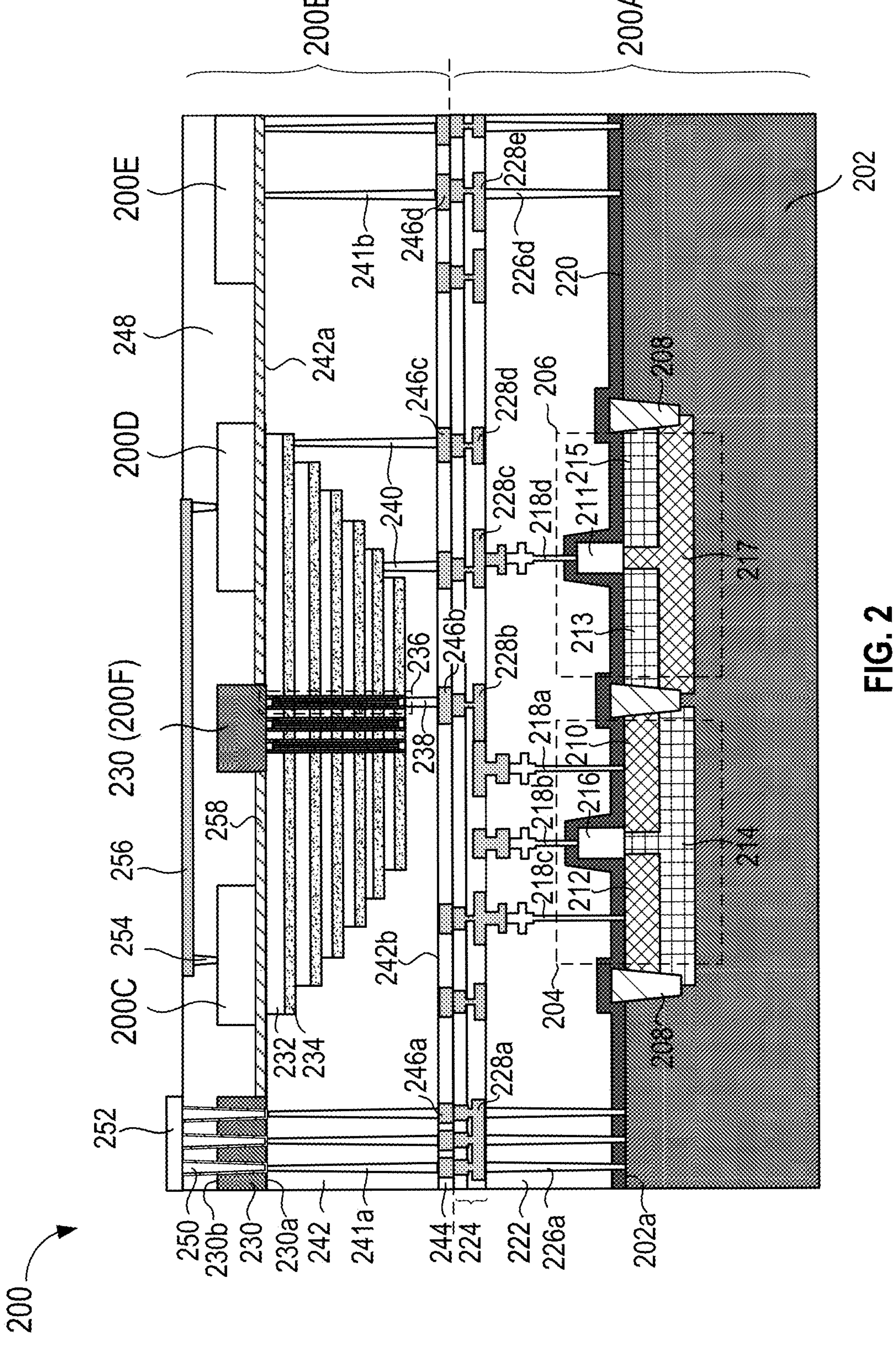
FIG. 2 is a cross-sectional view of a 3D integration structure, in accordance with exemplary embodiments of the disclosure.

FIG. 2 shows an exemplary embodiment of a structure 200. In an exemplary embodiment of FIG. 2, the structure 200 can be an X-tacking structure that integrates a 3D-NAND memory device and one or more other electronic structures (or modules) 200C-200F to implement multiple functions. The one or more electronic structures 200C-200F can include various types of structures such as a logic electronic structure (e.g., a logic chip, a logic module, or logic circuitry), a memory electronic structure (e.g., a memory, a memory chip, or a memory module), and/or an analog electronic structure (e.g., an analog chip, an analog module, or analog circuitry). The 3D-NAND memory device can include a structure 200A and a structure 200B, where the structure 200B is positioned over and bonded to the structure 200A. In an embodiment of FIG. 2, the structure 200A can be a CMOS structure (or CMOS module) 200A that is formed over a CMOS substrate (or CMOS wafer) 202, and the structure 200B can be a memory cell structure (or memory cell module) 200B that is formed over a cell substrate (cell substrate layer or cell wafer) 230.

Still referring to FIG. 2, the CMOS structure 200A can include a plurality of transistors (e.g., 204 and 206) that are formed in a first side **202*a* of the CMOS substrate 202 and positioned in a bottom dielectric structure 222. The plurality of transistors can be covered by an isolation layer 220, and spaced apart from one another by one or more shallow trench isolations (STIs) 208. The plurality of transistors can form periphery circuits that are configured to operate memory cells of the 3D-NAND memory device, such as handling data I/O as well as memory cell operations. In an exemplary embodiment of FIG. 2, the transistor 204 can be an n-type transistor and the transistor 206 can be a p-type transistor, for example. The transistor 204 can include a first source/drain (S/D) region 210 and a second S/D region 212 that are doped with an n-type dopant, and extend into the CMOS substrate 202 from the first side 202*a*. The first S/D region 210 and second S/D region 212 can further be positioned in a p-type well 214. The transistor 204 can also include a gate structure 216 that is positioned over the first side 202*a* of the CMOS substrate 202, and arranged between the first and second S/D regions 210 and 212. Similarly, the transistor 206 can include a first S/D region 213 and a second S/D region 215 that are doped with a p-type dopant, and positioned in a n-type well 217, and a gate structure 211 that is positioned between the first and second S/D regions 213 and 215**.

The CMOS structure 200A can include a plurality of source/drain (S/D) contacts (e.g., 218*a*, 218*c*) extending from the S/D regions (e.g., 210 and 212) of the plurality of transistors, a plurality of gate contacts (e.g., 218*b* and 218*d*) extending from gate structures (e.g., 211 and 216) of the plurality of the transistors, and a plurality of bottom contacts 226, such as shown by 226*a* and 226*d*, extending from the first side 202*a* of the CMOS substrate 202 and extending through the bottom dielectric structure 222. The CMOS structure 200A can further include a plurality of bottom metal lines 228, such as shown by 228*a*-228*e*, that are formed over the bottom dielectric structure 222 and coupled to the plurality of S/D contacts (e.g., 218*a* and 218*c*), the plurality of gate contacts (e.g., 218*b* and 218*d*), and the plurality of bottom contacts 226. The bottom metal lines 228 can further be disposed in a backend of line (BEOL) dielectric stack 224. The bottom metal lines 228 can include one or more metal layers (e.g., M1 layer and M2 layers) that are stacked over the bottom dielectric structure 222, and coupled to each other through a plurality of vias positioned between the one or more metal layers.

In an embodiment of FIG. 2, the S/D contacts, the gate contacts, and the bottom contacts can be made of a conductive material, such as W, Co, Ru, or the like. The bottom metal lines 228 can be made of Cu, Al, W, or the like. The isolation layer 220 and the STIs 208 can be made of a dielectric material, such as SiO, SiN, or the like. The bottom dielectric structure 222 can include one or more dielectric layers, such as SiO, SiN, TEOS, BPSG, PSG, USG, or the like.

The memory cell structure 200B can include a stack of alternating insulating layers 232 and word lines 234 that is positioned over a first side 230*a* of the cell substrate 230 in a staircase configuration and arranged in a top dielectric structure 242, a plurality of channel structures 236 that extends from the first side 230*a* of the cell substrate 230 and extends through the insulating layers 232 and the word lines 234, and a plurality of word line contacts 240 that are positioned over the first side 230*a* of the cell substrate 230 and extend from the word lines 234. In addition, one or more channel contacts 238 can be formed over the first side 230*a* of the cell substrate 230 and extend from the plurality of channel structures 236.

The top dielectric structure 242 can have a first surface (or bottom surface) 242*a* that is in contact with the first side 230*a* of the cell substrate 230, and a second surface (or top surface) 242*b* that is opposite to the first surface 242*a*. A portion of the first surface 242*a* of the top dielectric structure 242 can be exposed or not covered by the cell substrate 230.

The memory cell structure 200B can also include a plurality of top contacts 241, such as shown by 241*a* and 241*b*, and a plurality of TSVs 250. The plurality of top contacts 241 can extend from the first side 230*a* of the cell substrate 230 and extend through the top dielectric structure 242. The plurality of TSVs 250 can be formed in the cell substrate 230, and further extend through the cell substrate 230 and be in contact with the plurality of top contacts (e.g., 241*a*). The memory cell structure 200B can include a plurality of top metal lines 246, such as shown by 246*a*-246*d*, formed over the second surface 242*b* of the top dielectric structure 242. The plurality of top metal lines 246 can be positioned in a BEOL dielectric layer 244 and coupled to the plurality of channel structures 236, the plurality of top contacts 241, the plurality of word line contacts 240, and the one or more channel contacts 238. Further, one or more pad structures 252 can be positioned over and coupled to the plurality of TSVs 250.

In some embodiments, the insulating layers 232 can be made of oxide and the word lines 234 can be made of a conductive material, such as W. The word line contacts 240, the top contacts 241 can be made of W, Co, Ru, or the like. The top dielectric structure 242 can include one or more dielectric layers, such as SiO, SiN, TEOS, BPSG, PSG, USG, or the like. The plurality of top metal lines 246 can be made of Cu, Al, W, or the like. The TSVs 250 can be made of Cu, W, or the like.

In the X-tacking structure 200, the CMOS structure 200A and memory cell structure 200B can be coupled to each other to form a 3D-NAND memory device, where the memory cell structure 200B can include memory cells for data storage and the CMOS structure 200A can include periphery circuits to handle data I/O as well as memory cell operations, such as programming, erasing, and reading. As shown in FIG. 2, the CMOS structure 200A and memory cell structure 200B can be coupled to each other through the plurality of top metal lines 246 and the plurality of bottom metal lines 228, where the plurality of top metal lines 246 and the plurality of bottom metal lines 228 can be in contact with each other through a plurality of bonding vias (not shown) that is positioned between the plurality of top metal lines 246 and the plurality of bottom metal lines 228. The bonding vias can include Cu, W, Al, Ti, TiN, or the like.

The X-tacking structure 200 can further include a plurality of electronic structures, such as electronic structures 200C-200F. As shown in FIG. 2, a portion of the first surface 242*a* of the top dielectric structure 242 may not be covered by the cell substrate 230, and the electronic structures 200C-200E can be positioned over the uncovered portion of the first surface 242*a* of the top dielectric structure 242. The electronic structures 200C-200E can further be bonded to the top dielectric structure 242, such as through a polysilicon layer 258 and spaced apart from one another by an isolation layer 248. In order to bond the electronic structures 200C-200E to the top dielectric structure 242, the polysilicon layer 258 can be formed over the uncovered portion of the first surface 242*a* of the top dielectric structure 242. The electronic structures 200C-200E can be positioned on the polysilicon layer 258, and a laser annealing process can be performed, where a laser beam can be directed toward the uncovered portion of the first surface 242*a* of the top dielectric structure 242. The polysilicon layer 258 can be heated subsequently by the laser energy transmitted by the laser beam and consequently bond (or glue) the electronic structures 200C-200E and the top dielectric structure 242 to each other. It should be noted that the polysilicon layer 258 can further function as a substrate for the electronic structures 200C-200E.

In another example, the plurality of electronic structures can include one or more electronic structures that are formed from, or based on, a portion of the cell substrate 230 at the second side 230*b* of the cell substrate 230. For example, an electronic structure 200F can be formed based on a portion of the cell substrate 230 that is in contact with the plurality of channel structures 236.

The electronic structures 200C-200F can be a logic electronic structure (e.g., a logic chip, a logic module, or logic circuitry), a memory electronic structure (e.g., a memory, a memory chip, storage circuitry, or a memory module), an analog electronic structure (e.g., an analog chip, an analog module, or analog circuitry), or the like. The electronic structures 200C-200F can provide multiple functions. For example, the logic electronic structure can be a microcontroller unit (MCU) that can include one or more processing cores which can execute firmware to operate the memory cells for reading, erasing, or programming. The analog electronic structure can include analog sensor circuitry that is a part of read circuitry for reading the data from the memory cells. Thus, in the X-tacking structure 200, multiple functions can be integrated by stacking the multiple electronic structures (e.g., 200A-200F).

In some embodiments, one or more of the electronic structures 200C-200F can be a part of the memory cell module of the 3D-NAND memory device. Thus, the one or more of the electronic structures 200C-200F can also include a plurality of memory cells, and work with the memory cell structure 200B for data storage. In some embodiments, one or more of the electronic structures 200C-200F can be a part of the CMOS module of the 3D-NAND memory device that are configured to operate memory cells. Accordingly, the one or more of the electronic structures 200C-200F can include a plurality of transistors, such as high voltage transistors, and work with the CMOS structure 200A to operate the memory cells.

In some embodiments, a first electronic structure (e.g., 200C) and a second electronic structure (e.g., 200D) of the plurality of electronic structures can be coupled to each other through packaging vias (e.g., 254) and packaging metal lines (e.g., 256). In some embodiments, a third electronic structure (e.g., 200E) of the plurality of electronic structures can be coupled to one of the plurality of transistors in the CMOS structure 200A through, or based on, one of the plurality of top contacts (e.g., 241*b*) and one of the plurality of second contacts (e.g., 226*d*).

It should be noted that the structure 200B is not limited to a memory cell structure. The structure 200B can also include other electronic structures, such as a logic electronic structure or an analog electronic structure. Thus, the structure 200B can include devices that include field effect transistors, diodes, bipolar junction transistors, capacitors, resistors, inductors, the like, or the combination thereof. The structure 200B can also be a DRAM structure or other external circuitry. Similarly, the structure 200A is not limited to a CMOS structure. The structure 200A can be a DRAM structure, a NAND structure, or other external circuitry.

Further, FIG. 2 is merely an example. The structure 200 is not limited to an X-tacking structure. For example, the structure 200 can include a periphery portion under a core array (PUC) portion, where the periphery portion is formed over a top surface of a substrate, and the core array portion is formed over the periphery portion. Further, electronic structures (e.g., 200C-200E) can be formed over the core array portion or arranged over an opposing bottom surface of the substrate. In another embodiment, the structure 200 can include the structure 200B only on which the plurality of electronic structures (e.g., 200C-200F) can be positioned over the uncovered portion of the first surface of the top dielectric structure. In yet another embodiment, the structure 200 can include one or more substrates that can be stacked either under the structure 200A or over the structure 200B, on which devices are formed over the one or more substrates.

Figure 3:
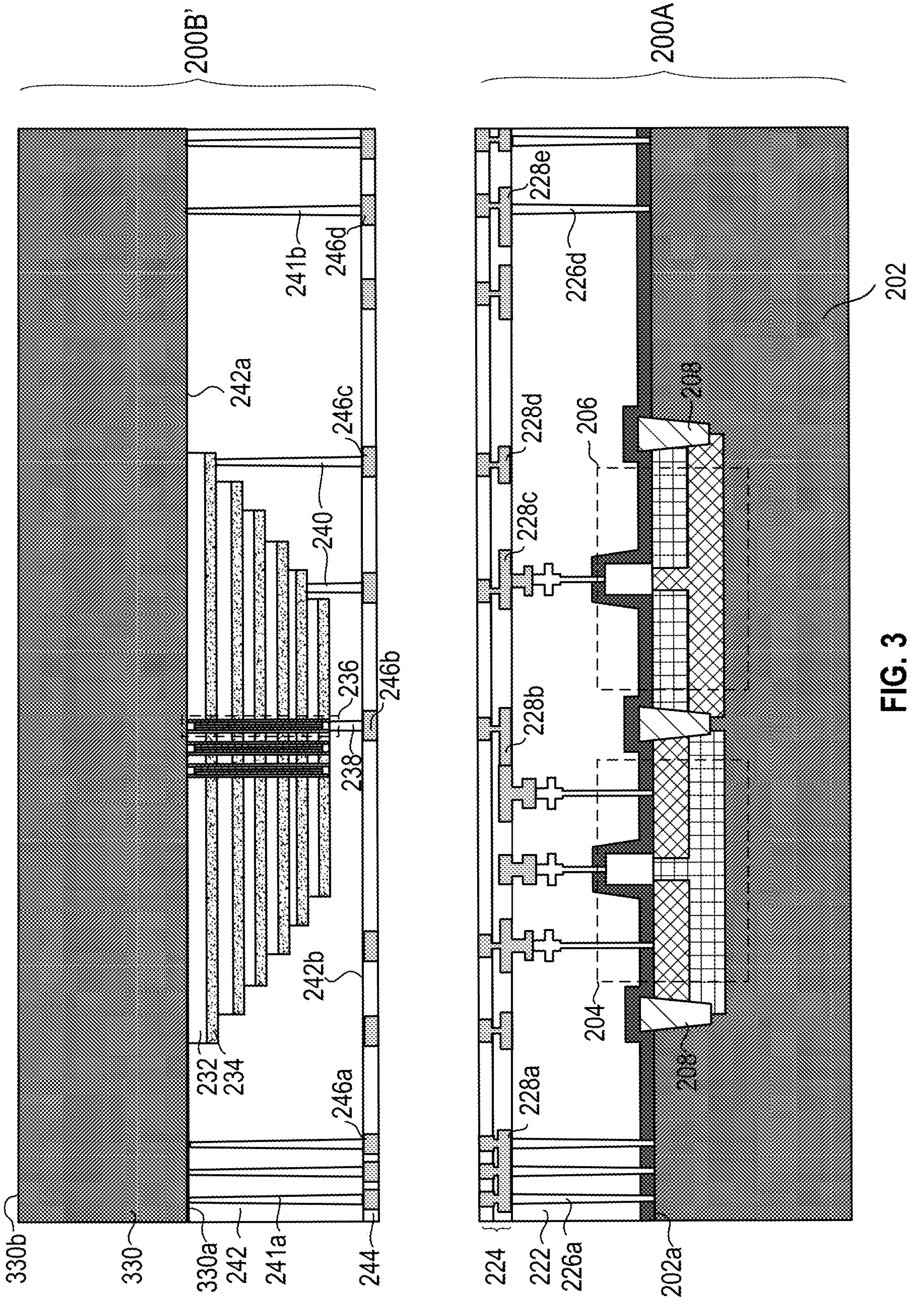
FIGS. 3-8 are cross-sectional views of various intermediate steps of manufacturing a 3D integration structure, in accordance with exemplary embodiments of the disclosure.

FIGS. 3-8 show cross-sectional views of various intermediate steps of manufacturing an X-tacking structure. As shown in FIG. 3, a CMOS structure 200A can be formed. The CMOS structure 200A can have similar configurations as the CMOS structure 200A in FIG. 2. In addition, a memory cell structure 200B' can be formed. The memory cell structure 200B' can include a cell substrate 330 that has a first side 330*a* and an opposing second side 330*b*. Similar to the memory cell structure 200B, the memory cell structure 200B' can include a stack of alternating insulating layers 232 and word lines 234 that are positioned over the first side 330*a* of the cell substrate 330 in a staircase configuration. A top dielectric structure 242 is formed over the first side 330*a* of the cell substrate 330 such that the insulating layers 232 and the word lines 234 are arranged in the top dielectric structure 242. A plurality of channel structures 236 extends from the first side 330*a* of the cell substrate 330 and extends through the insulating layers 232 and the word lines 234. A plurality of word line contacts 240 is positioned over the first side 330*a* of the cell substrate 330 and extends from the word lines 234. A plurality of top contacts 241, such as shown by 241*a* and 241*b*, extends from the first side 330*a* of the cell substrate 330 and extends through the top dielectric structure 242. Further, a plurality of top metal lines 246, such as shown by 246*a*-246*d*, can be formed over a second surface 242*b* of the top dielectric structure 242, where the plurality of top metal lines 246 can be coupled to the plurality of channel structures 236, the plurality of top contacts 241, and the plurality of word line contacts 240.

The CMOS structure 200A and the memory cell structure 200B' can be formed based on various semiconductor manufacturing processes that can include a film deposition process (e.g., a chemical vapor deposition (CVD) process, a physical vapor deposition (PVD) process, a diffusion process, an atomic layer deposition (ALD) process, and/or a sputtering process), an etching process (e.g., a wet etch process and/or a dry etch process), a photolithography process, a chemical-mechanical planarization (CMP) process, a metrology process, a defect detection process, a parametric measurement process, and/or the like.

Figure 4:
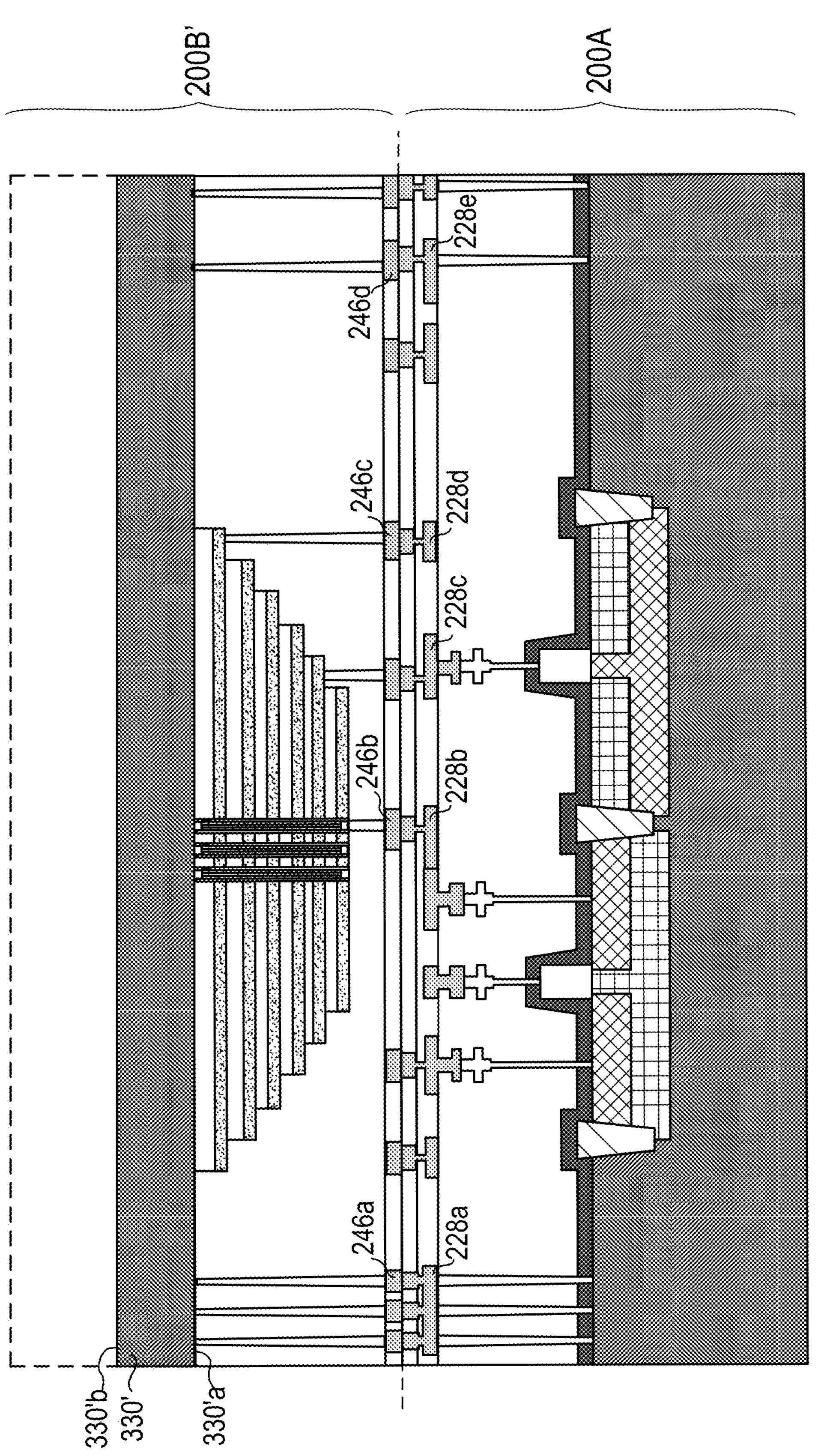

In FIG. 4, a plurality of bonding vias (not shown) can be formed over the top metal lines 246 and/or the bottom metal lines 228 (e.g., 228*a*-228*e*). Subsequently, a thermal process can be applied to bond the top metal lines 246 and the bottom metal lines 228 through the bonding vias. In addition, the cell substrate 330 can be thinned down from the second side 330*b* of the cell substrate 330. Accordingly, the cell substrate 330 can become cell substrate 330' with a first side 330'*a* and an opposing second side 330'*b*. In order to thin down the cell substrate 330, a CMP process or a blank etching process can be applied that can remove a portion of the cell substrate 330 from the second side 330*b*.

Figure 5:
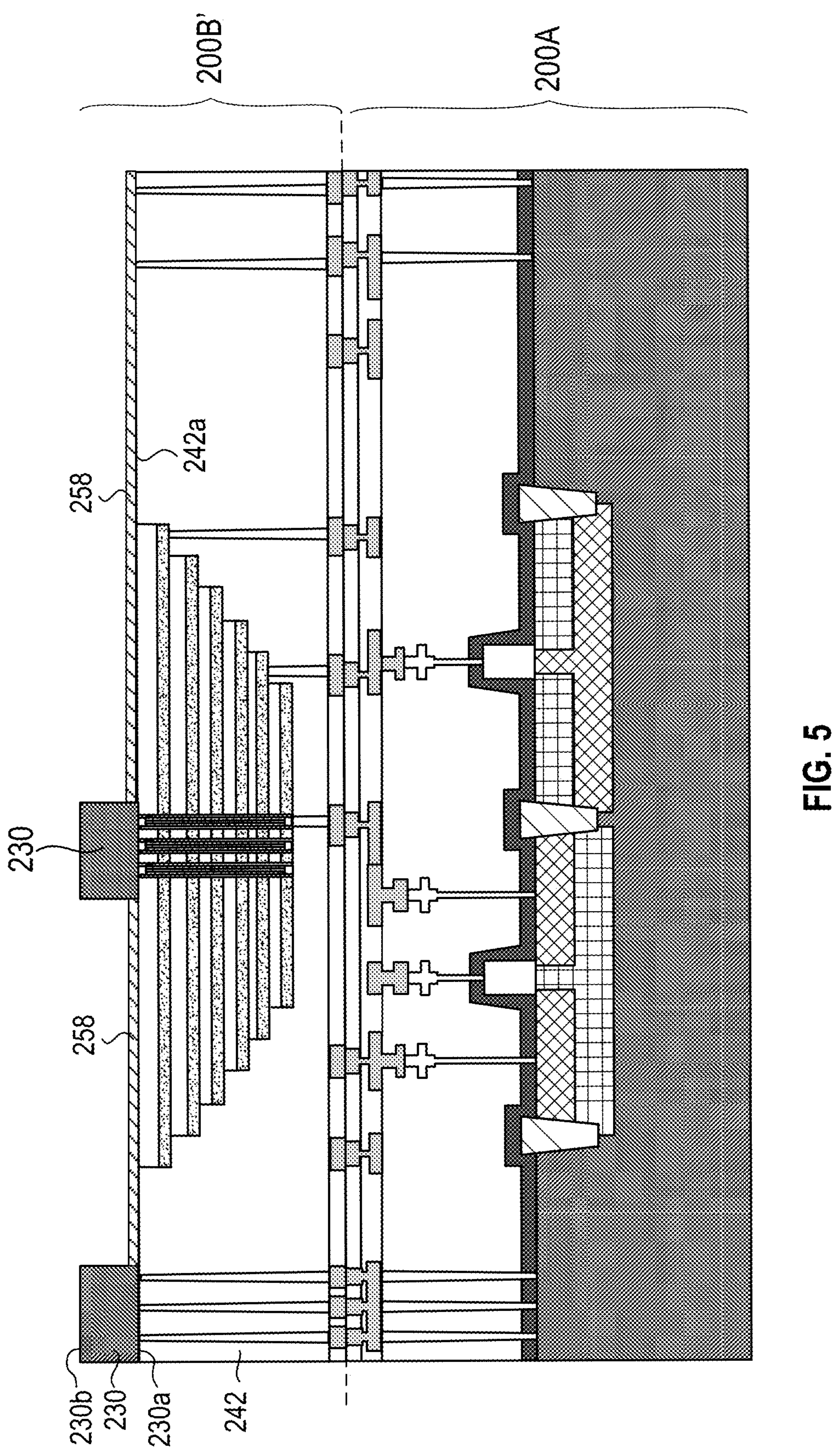

In FIG. 5, a portion of the cell substrate 330' can be removed. Accordingly, the cell substrate 330' becomes the cell substrate 230, or cell substrate layer, with a first side 230*a* and an opposing second side 230*b*. In addition, a portion of the first surface 242*a* of the top dielectric structure 242 is not covered by the cell substrate 230. A polysilicon layer 258 can be formed over the uncovered first surface 242*a* of the top dielectric structure 242. In order to form the polysilicon layer 258, various deposition processes can be applied, such as a low pressure CVD process, a PVD process, a sputtering process, or an ALD process. In order to remove the portion of the cell substrate 330', a patterning process can be applied that includes a photolithography process and an etching process. The photolithography process can form photoresist patterns that cover a portion of the cell substrate 330', and the etching process can subsequently be applied to remove a portion of the cell substrate 330' that is not covered by the photoresist patterns.

Figure 6:
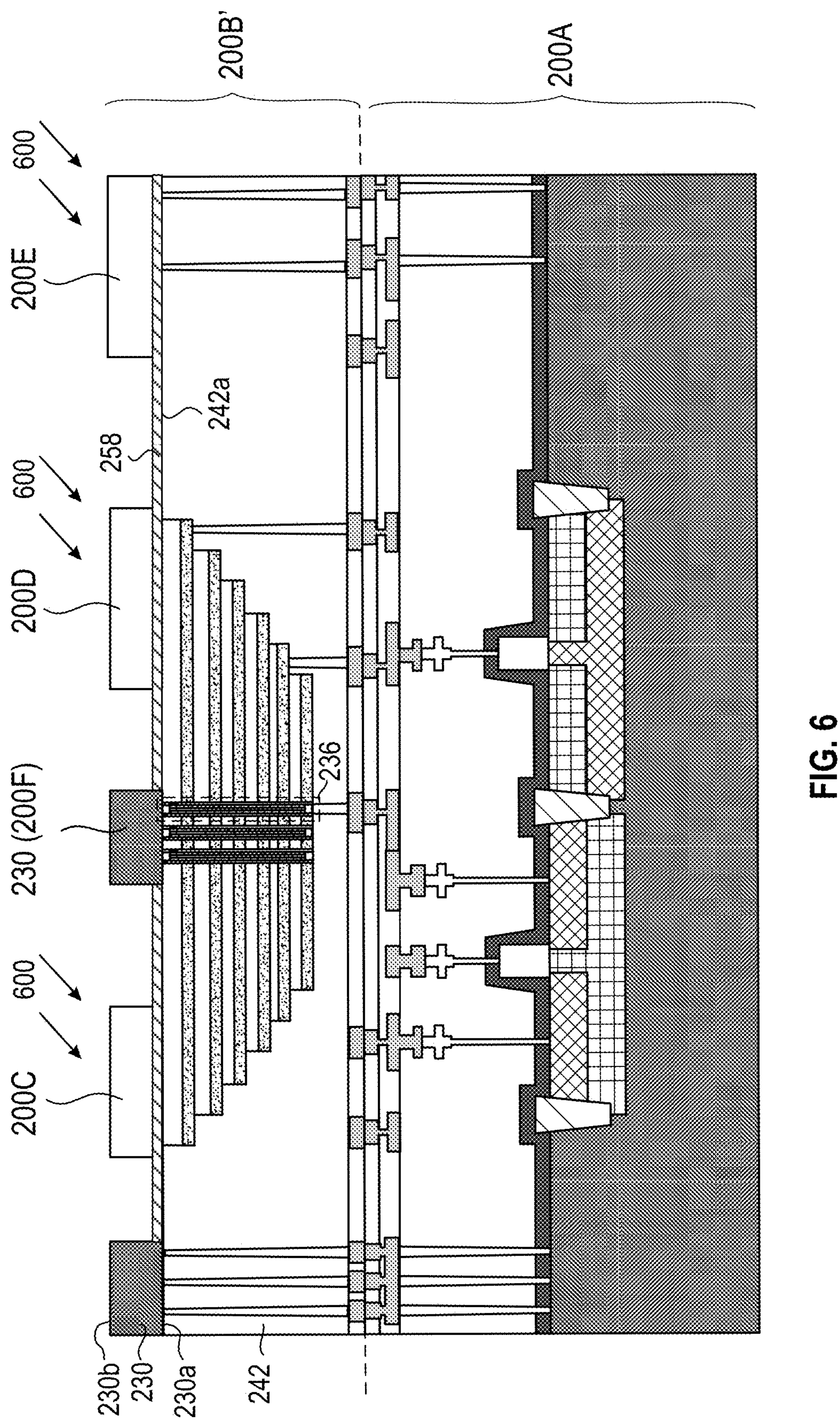

In FIG. 6, a plurality of electronic structures 200C-200E can be positioned over the polysilicon layer 258, where the polysilicon layer 258 can function as a substrate for the electronic structures 200C-200E. Further, an annealing process, such as a laser annealing process 600, can be applied on the memory cell structure 200B'. The laser annealing process 600 can direct a laser beam toward the uncovered portion of the first surface 242*a* of the top dielectric structure 242. The polysilicon layer 258 can be heated subsequently by the laser energy transmitted by the laser beam and consequently bond (or glue) the electronic structures 200C-200E and the top dielectric structure 242 from each other.

In some embodiments, the laser annealing process can include a laser source that can generate a laser beam with a wavelength in a range from 350 nm to 650 nm. For example, the laser source can generate a purple laser beam with a wavelength from 375 nm to 405 nm, a green laser beam with a wavelength from 520 nm to 532 nm, or a red laser beam with a wavelength from 635 nm to 650 nm. The laser beam can have laser energy larger than 0.1 J/cm$^2$. The laser process can be a continuous laser annealing process in which a laser beam can be directed to the memory cell structure 200B' in a continuous duration. The laser process can also be a pulsed laser annealing process in that pulsed laser beams can be directed to the memory cell structure 200B', where each of the pulsed laser beam can have a duration from 10 fs to 1 us.

It should be noted that one or more electronic structures can be formed from, or based on, a portion of the cell substrate 230 at the second side 230*b* of the cell substrate 230. For example, an electronic structure 200F can be formed based on a portion of the cell substrate 230 that is in contact with the channel structures 236.

Figure 7:
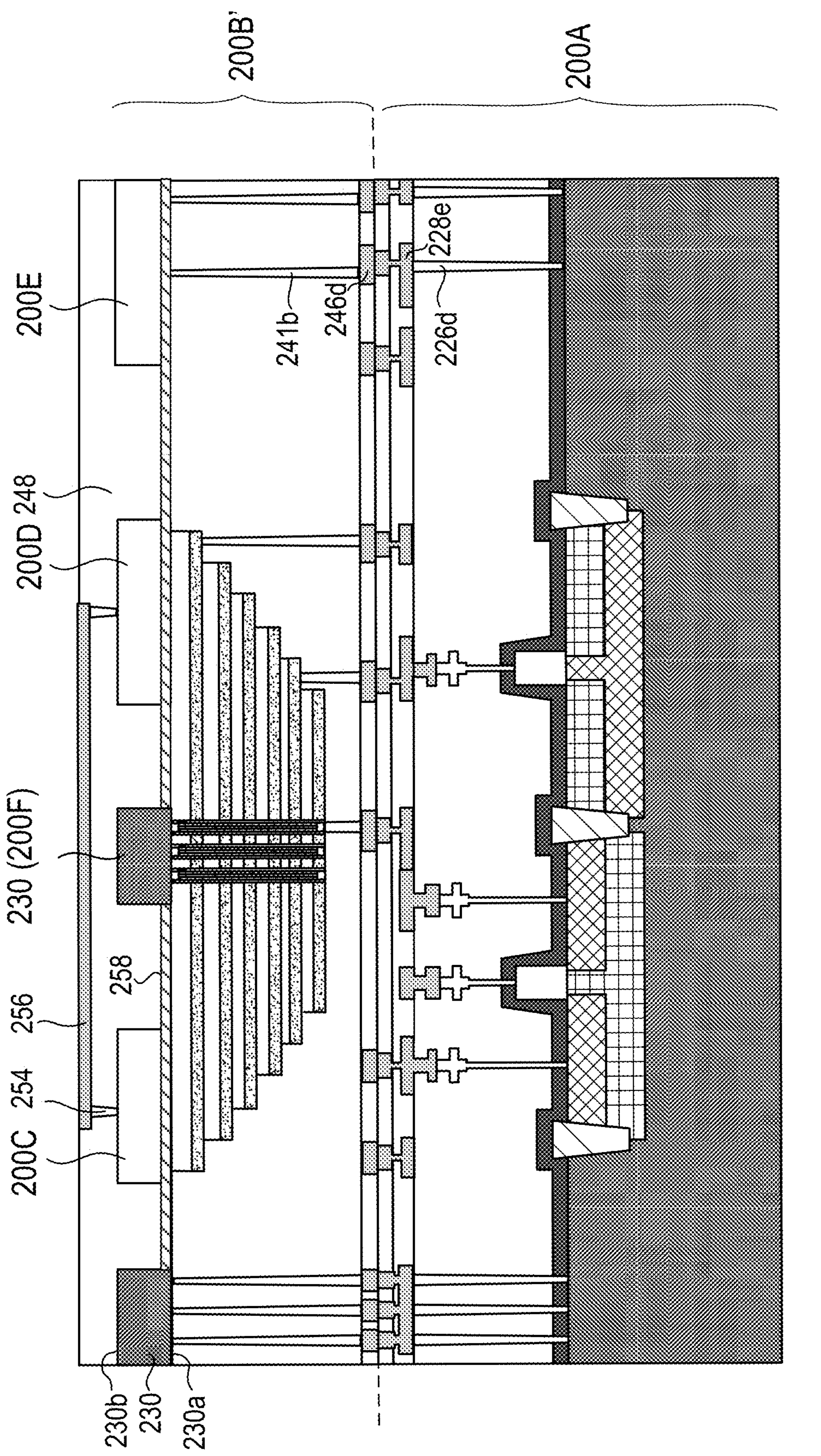

The plurality of electronic structures can have an internal connection in which two or more electronic structures can be connected to each other, and an external connection in which one or more electronic structures can be coupled to the transistors in the CMOS structure 200A. For example, as shown in FIG. 7, the electronic structure 200C and the electronic structure 200D can be coupled to each other through packaging vias (e.g., 254) and packaging metal lines (e.g., 256). In another example, the electronic structure 200E can be coupled to the CMOS structure 200A through a connection channel that is formed by the top contact 241*b*, the top metal line 246*d*, the bottom metal line 228*e*, and the bottom contact 226*d*. It should be noted that in order to form the packaging via (e.g., 254) and the packaging metal line (e.g., 256), an isolation layer 248 can be formed over the electronic structures 200C-200D. A patterning process can be applied to form via openings and metal line openings, and a deposition process can be applied to fill the via openings and the metal line openings with conductive materials to form the packaging via (e.g., 254) and the packaging metal line (e.g., 256).

Figure 8:
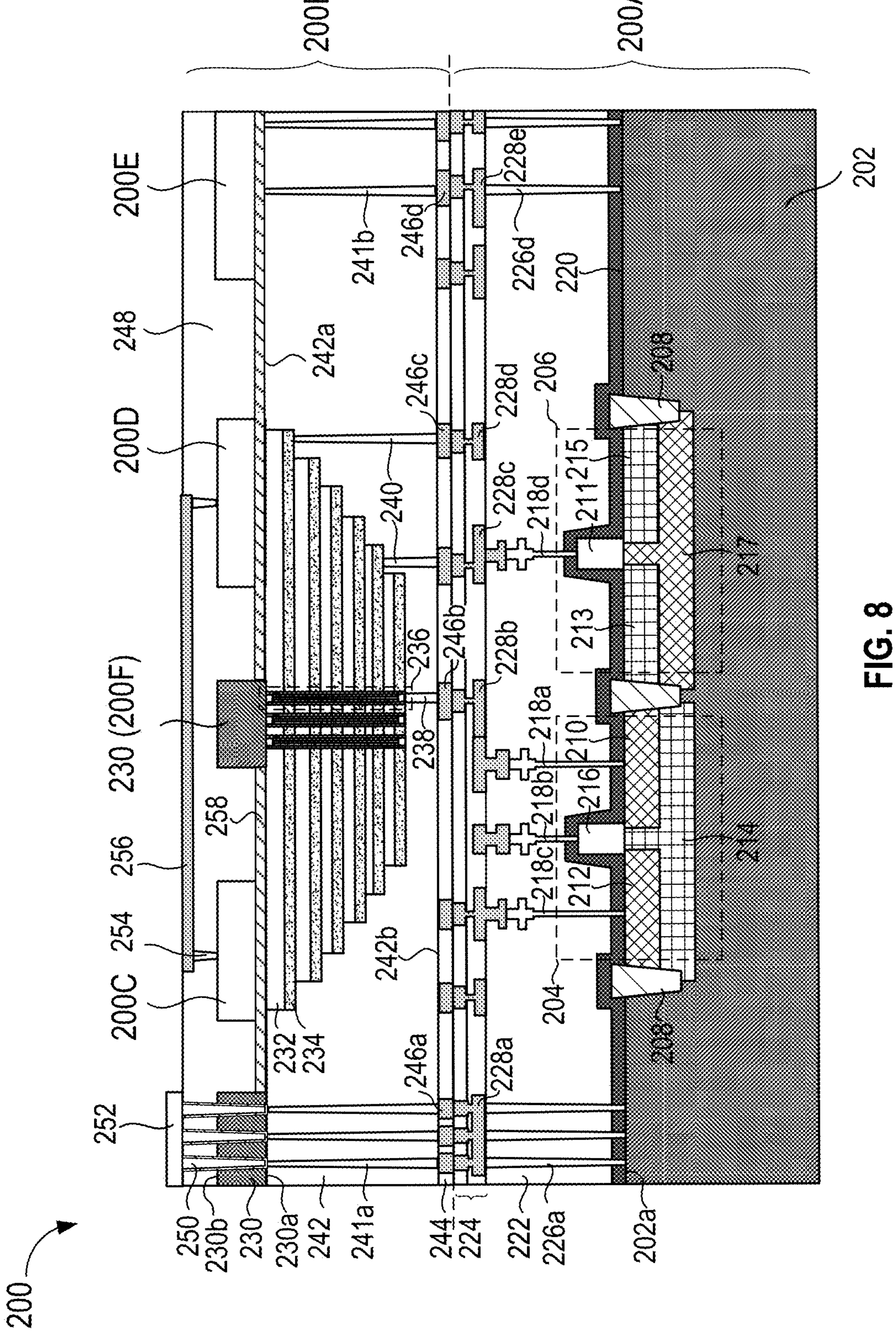

In FIG. 8, a memory cell structure 200B can be formed, where a plurality of TSVs 250 can be formed in the cell substrate 230, and one or more pad structures 252 can be formed over and coupled to the plurality of TSVs 250. The plurality of TSVs 250 can extend through the cell substrate 230 and be in contact with the plurality of top contacts (e.g., 241*a*). The pad structures 252 can be test pads on which probe bins from a test tool can be applied. The pad structure 252 can also be bonding pads that are interconnected to an external component, such as a packaged chip.

The memory cell structure 200B and the CMOS structure 200A can form an X-tacking structure 200 that can be identical to the X-tacking structure 200 in FIG. 2. For example, the X-tacking structure 200 in FIG. 8 can include a 3D-NAND memory device that is implemented by the memory cell structure 200B and the CMOS structure 200A. The X-tacking structure 200 can also include the electronic structures 200C-200E that are positioned over the uncovered portion of the first surface 242*a* of the top dielectric structure 242 to provide multiple functions.

Figure 9:
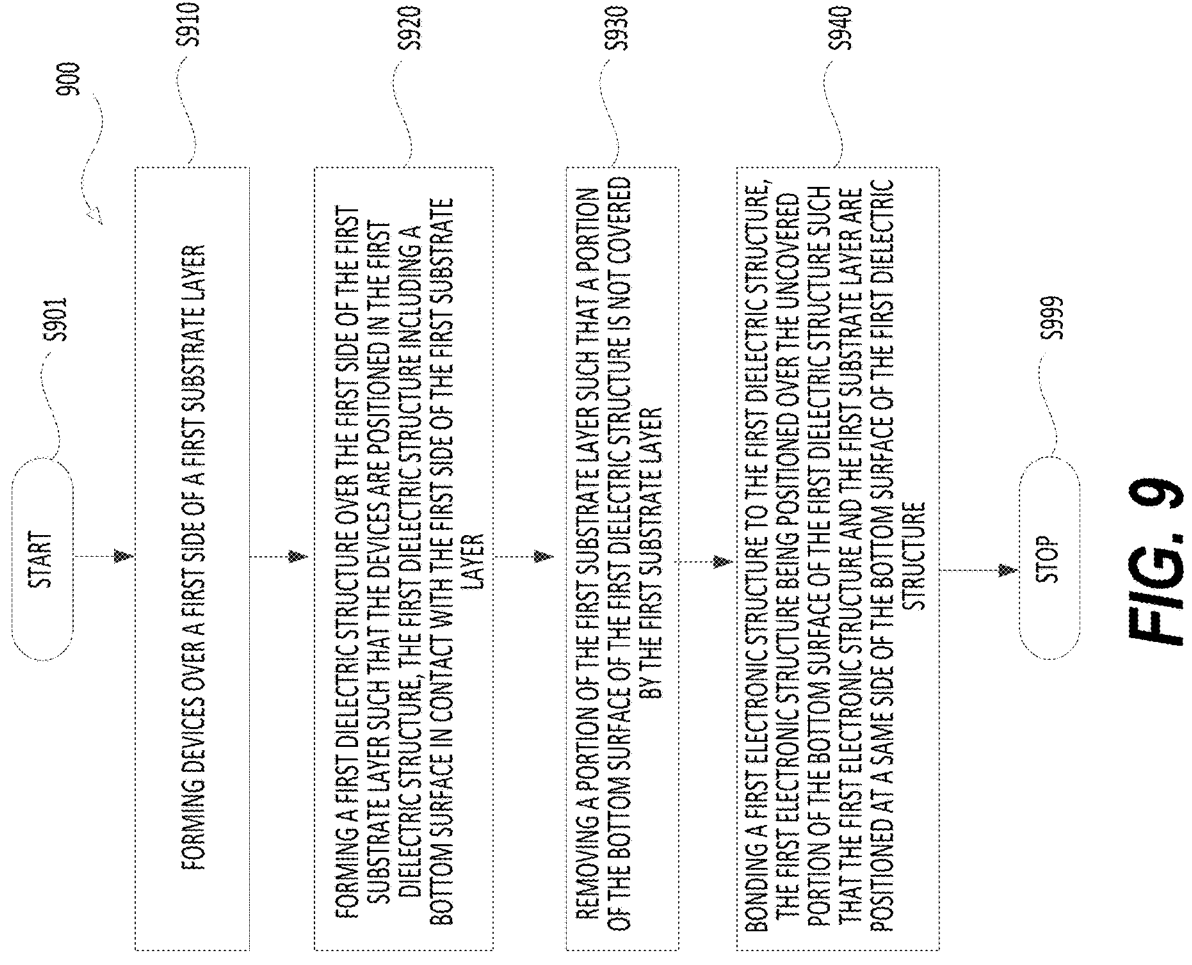
FIG. 9 is a flowchart of a process for manufacturing a 3D integration structure, in accordance with exemplary embodiments of the disclosure.

FIG. 9 is a flowchart of an exemplary process 900 for fabricating a semiconductor device. The process 900 begins at S901, and then proceeds to S910. At S910, devices can be formed over a first side of a first substrate layer that includes a second side opposite to the first side.

In some embodiments, the plurality of electronic structures can include one of logic circuitry, storage circuitry, and analog circuitry, and the devices can include at least one of a field effect transistor, a diode, a bipolar junction transistor, a capacitor, a resistor, an inductor, or a memory cell.

In some embodiments, the forming the devices can include forming memory cells over the first side of the first substrate layer. The memory cells can include a stack of alternating insulating layers and word lines that is positioned over the first side of the first substrate layer in a staircase configuration and arranged in the first dielectric structure. The memory cells can also include a plurality of channel structures that extend from the first side of the first substrate layer and extend through the insulating layers and the word lines. The memory cells can further include and a plurality of word line contacts that are positioned over the first side of the first substrate layer and extend from the word lines.

The process 900 then proceeds to S920. At S920, a first dielectric structure can be formed over the first side of the first substrate layer such that the devices are positioned in the first dielectric structure, where the first dielectric structure can include a first surface in contact with the first side of the first substrate layer and a second surface opposite to the first surface. In some embodiments, S910 and S920 can be performed as illustrated with reference to FIG. 3.

At S930, a portion of the first substrate layer can be removed such that a portion of the first surface of the first dielectric structure is uncovered by the first substrate layer. In some embodiments, before the portion of the first substrate layer is removed so that the portion of the first surface of the first dielectric structure is uncovered by the first substrate layer, the first substrate layer can be thinned down from the second side of the first substrate. In some embodiments, S930 can be performed as illustrated with reference to FIGS. 4 and 5.

The process 900 can then proceed to S940, where a plurality of electronic structures can subsequently be bonded to the first dielectric structure. The plurality of electronic structures can be positioned over the uncovered portion of the first surface of the first dielectric structure and spaced apart from one another. In some embodiments, S940 can be performed as illustrated with reference to FIG. 6.

In the process 900, in order to bond the plurality of electronic structures, a polysilicon layer can be formed over the uncovered portion of the first surface of the first dielectric structure. The plurality of electronic structures can be positioned over the polysilicon layer. An annealing process can subsequently be performed so that the polysilicon layer can connect the plurality of electronic structures and the first dielectric structure and function as a substrate layer for the plurality of electronic structures.

In some embodiments, the annealing process includes a laser annealing process. The laser process can have laser energy larger than 0.1 J/cm$^2$, a laser beam wavelength in a range from 350 nm to 650 nm, a process time in a range from 10 fs to 1 us per pulse. The laser process can be a continuous laser annealing process or a pulsed laser annealing process.

In some embodiments, one of the plurality of electronic structures can be formed from a portion of the first substrate layer. Similarly, the one of the plurality of electronic structures can be logic circuitry, storage circuitry, or analog circuitry.

In some embodiments, one or more of the plurality of the electronic structures can be a part of periphery circuitry that is configured to operate memory cells. Accordingly, the one or more of the plurality of the electronic structures can include a plurality of transistors, such as high voltage transistors of the periphery circuitry.

In the process 900, as shown in FIG. 8, a plurality of first contact structures can be formed to extend from the first side of the first substrate layer and extend through the first dielectric structure. A plurality of TSVs can be formed in the first substrate layer, where the plurality of TSVs can extend through the first substrate layer and be in contact with the plurality of first contact structures. A plurality of first metal lines can be formed over the second surface of the first dielectric structure, where the plurality of first metal lines can be coupled to the plurality of channel structures, the plurality of first contact structures, and the plurality of word line contacts. Further, one or more pad structures can be formed over and coupled to the plurality of TSVs.

In the process 900, as shown in FIG. 3, a second dielectric structure can be formed over a first side of a second substrate layer, where the first side of the first substrate layer and the first side of the second substrate layer can be aligned facing each other. A plurality of transistors can be formed in the first side of a second substrate layer. The plurality of transistor can be positioned in the second dielectric structure and configured to control the memory cells. A plurality of second metal lines can be formed over the second dielectric structure. The plurality of second metal lines can be coupled to the plurality of first metal lines so that the memory cells are coupled to the plurality of transistors. In some embodiments, the plurality of transistors can form periphery circuitry to operate the memory cells formed over the first side of the first substrate layer.

In the process 900, as shown in FIG. 3, a plurality of S/D contacts can be formed to extend from S/D regions of the plurality of transistors. A plurality of gate contacts can be formed to extend from gate structures of the plurality of the transistors. A plurality of second contact structures can be formed to extend from the first side of the second substrate layer and extend through the second dielectric structure. The plurality of second metal lines can be coupled to the plurality of S/D contacts, the plurality of gate contacts, and the plurality of second contact structures. The plurality of first metal lines can be coupled to the plurality of second metal lines through a plurality of bonding vias. The plurality of bonding vias can be positioned between the plurality of first metal lines and the plurality of second metal lines.

In some embodiments, as shown in FIG. 8, a first electronic structure and a third electronic structure of the plurality of electronic structures can be coupled to each other, and a fourth electronic structure of the plurality of the electronic structures can be coupled to one of the plurality of transistors through one of the plurality of first contact structures and one of the plurality of second contact structures.

It should be noted that the process 900 is not limited to an X-tacking structure. It can be applied to other structures, such as a PUC structure. In addition, one or more substrates can be positioned either under the second substrate layer or over the first structure layer, on which devices are formed over the one or more substrates. The devices formed over the first substrate layer can also be a DRAM structure, or other external circuitry. Further, a DRAM structure, a NAND structure, or other external circuitry can also be formed over the first side of the second substrate layer.

It should be noted that additional steps can be provided before, during, and after the process 900, and some of the steps described can be replaced, eliminated, or performed in different order for additional embodiments of the process 900. In subsequent process steps, various additional interconnect structures (e.g., metallization layers having conductive lines and/or VIAs) may be formed over the X-tacking structure (e.g., 200). Such interconnect structures electrically connect the X-tacking structure (e.g., 200) with other contact structures and/or active devices to form functional circuits. Additional device features such as passivation layers, input/output structures, and the like may also be formed.

The various embodiments described herein offer several advantages over related examples. The current disclosure provides an X-tacking structure to integrate different/multiple modules (or device structures) based on the laser annealing process. The X-tacking structure can apply a TSV-free architecture so that issues of the density and quantity of connecting through holes associated with the TSV can be solved. The X-tacking structure can also be compatible with the integration of multiple modules (or device chips, device structures), through which high space utilization efficiency can be obtained. The laser annealing process can solve the influence of a high temperature on the reliability of metal interconnection. Further, the X-tacking structure can be applied to bond one or more wafers, based on the designs of the X-tacking structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:

a first substrate layer having a first side over which devices are formed;

a first dielectric structure formed over the first side of the first substrate layer in which the devices are positioned, the first dielectric structure including a bottom surface in direct contact with the first side of the first substrate layer, a portion of the bottom surface of the first dielectric structure not being covered by the first substrate layer; and a first electronic structure positioned over the uncovered portion of the bottom surface of the first dielectric structure such that the first electronic structure and the first substrate layer are positioned at a same side of the bottom surface of the first dielectric structure, the first electronic structure further being bonded to the first dielectric structure, wherein the devices include memory cells that further comprise:

a stack of alternating insulating layers and word lines that is positioned over the first side of the first substrate layer in a staircase configuration and arranged in the first dielectric structure;

a channel structure that extends through the insulating layers and the word lines; and a word line contact that is positioned over the first side of the first substrate layer and extends from one of the word lines, the semiconductor device further comprises:

a first contact structure extending from the first side of the first substrate layer and extending through the first dielectric structure;

a through silicon via (TSV) formed in the first substrate layer, the TSV extending through the first substrate layer and being in contact with the first contact structure;

a first metal line formed over the first side of the first substrate layer and arranged on a top surface the first dielectric structure that is opposite to the bottom surface, the first metal line being coupled to one of the channel structure, the first contact structure, and the word line contact; and a pad structure positioned over and coupled to the TSV, the semiconductor device further comprises:

a second dielectric structure formed over a first side of a second substrate layer, the first side of the first substrate layer and the first side of the second substrate layer being aligned;

a transistor formed in the first side of a second substrate layer and positioned in the second dielectric structure; and a second metal line formed over the second dielectric structure and coupled to the first metal line such that the memory cells are coupled to the transistor, the semiconductor device further comprises:

a source/drain (S/D) contact extending from a S/D region of the transistor;

a gate contact extending from a gate structure of the transistor; and a second contact structure extending from the first side of the second substrate layer and extending through the second dielectric structure, wherein:

the second metal line is coupled to one of the S/D contact, the gate contact, and the second contact structure, and the first metal line is coupled to the second metal line through a bonding via that is positioned between the first metal line and the second metal line, and the semiconductor device further comprises:

a second electronic structure positioned over the uncovered portion of the bottom surface of the first dielectric structure and coupled to the first electronic structure, and a third electronic structure coupled to the transistor through the first contact structure and the second contact structure.

2. The semiconductor device of claim 1, wherein the first electronic structure is bonded to the bottom surface of the first dielectric structure through a polysilicon layer, the polysilicon layer being positioned between the first electronic structure and the first dielectric structure.

3. The semiconductor device of claim 1, wherein the first electronic structure includes one of logic circuitry, storage circuitry, and analog circuitry.

4. A semiconductor device, comprising:

a first substrate layer having a first side over which devices are formed;

a first dielectric structure formed over the first side of the first substrate layer in which the devices are positioned, the first dielectric structure including a bottom surface in contact with the first side of the first substrate layer, a portion of the bottom surface of the first dielectric structure not being covered by the first substrate layer; and a first electronic structure positioned over the uncovered portion of the bottom surface of the first dielectric structure such that the first electronic structure and the first substrate layer are positioned at a same side of the bottom surface of the first dielectric structure, the first electronic structure further being bonded to the first dielectric structure, wherein the first electronic structure is bonded to the bottom surface of the first dielectric structure through a polysilicon layer, the polysilicon layer being positioned between the first electronic structure and the first dielectric structure, or the first electronic structure includes one of logic circuitry, storage circuitry, and analog circuitry.

5. The semiconductor device of claim 4, wherein the devices include at least one of a field effect transistor, a diode, a bipolar junction transistor, a capacitor, a resistor, or an inductor.

6. The semiconductor device of claim 4, wherein the devices include memory cells that further comprise:

a stack of alternating insulating layers and word lines that is positioned over the first side of the first substrate layer in a staircase configuration and arranged in the first dielectric structure, a channel structure that extends through the insulating layers and the word lines, and a word line contact that is positioned over the first side of the first substrate layer and extends from one of the word lines.

7. The semiconductor device of claim 6, further comprising:

a first contact structure extending from the first side of the first substrate layer and extending through the first dielectric structure;

a through silicon via (TSV) formed in the first substrate layer, the TSV extending through the first substrate layer and being in contact with the first contact structure;

a first metal line formed over the first side of the first substrate layer and arranged on a top surface the first dielectric structure that is opposite to the bottom surface, the first metal line being coupled to one of the channel structure, the first contact structure, and the word line contact; and a pad structure positioned over and coupled to the TSV.

8. The semiconductor device of claim 7, further comprising:

a second dielectric structure formed over a first side of a second substrate layer, the first side of the first substrate layer and the first side of the second substrate layer being aligned;

a transistor formed in the first side of a second substrate layer and positioned in the second dielectric structure; and a second metal line formed over the second dielectric structure and coupled to the first metal line such that the memory cells are coupled to the transistor.

9. The semiconductor device of claim 8, further comprising a source/drain (S/D) contact extending from a S/D region of the transistor;

a gate contact extending from a gate structure of the transistor; and a second contact structure extending from the first side of the second substrate layer and extending through the second dielectric structure, wherein:

the second metal line is coupled to one of the S/D contact, the gate contact, and the second contact structure, and the first metal line is coupled to the second metal line through a bonding via that is positioned between the first metal line and the second metal line.

10. The semiconductor device of claim 9, further comprising:

a second electronic structure positioned over the uncovered portion of the bottom surface of the first dielectric structure and coupled to the first electronic structure, and a third electronic structure coupled to the transistor through the first contact structure and the second contact structure.

* * * * *